United States Patent [19]

Gaertner

[11] Patent Number: 4,784,001
[45] Date of Patent: Nov. 15, 1988

[54] MAGNETIC FLOWMETER WITH ISOLATION AMPLIFIER AND RANGING CIRCUIT THEREFOR AND METHOD

[75] Inventor: Max H. Gaertner, Warminster, Pa.

[73] Assignee: Emerson Electric Co., St. Louis, Mo.

[21] Appl. No.: 72,407

[22] Filed: Jul. 13, 1987

[51] Int. Cl.⁴ ............................ G01F 1/60; H04B 9/00
[52] U.S. Cl. .................................. 73/861.12; 455/608
[58] Field of Search ........... 73/861.12, 861.16, 861.17; 455/608, 613

[56] References Cited

U.S. PATENT DOCUMENTS

| | | | |
|---|---|---|---|
| 4,309,909 | 1/1982 | Grebe, Jr. et al. | 73/861.12 |
| 4,545,257 | 10/1985 | Tomita et al. | 73/861.17 |
| 4,694,504 | 9/1987 | Porter et al. | 455/608 |
| 4,713,841 | 12/1987 | Porter et al. | 455/608 |

FOREIGN PATENT DOCUMENTS 130069 11/1978 Japan .

*Primary Examiner*—Charles A. Ruehl
*Attorney, Agent, or Firm*—Polster, Polster and Lucchesi

[57] ABSTRACT

An isolation amplifier especially suited for magnetic flowmeters includes circuitry for converting an analog input signal to a duty cycle imposed upon a digital waveform, including generating clock pulses for synchronizing the digital waveform. Low-cost opto-couplers are provided for optically transmitting the digital waveform and information representative of the clock pulses across a barrier which would degrade the analog input signal and for receiving the optically transmitted digital waveform and clock pulse information and recreating the digital waveform with imposed duty cycle therefrom. Circuitry for digitally ranging the duty-cycle signal before the analog signal is reconstructed is also disclosed.

49 Claims, 4 Drawing Sheets

MAGNETIC FLOWMETER WITH ISOLATION AMPLIFIER AND RANGING CIRCUIT THEREFOR AND METHOD

BACKGROUND OF THE INVENTION

This invention relates to magnetic flowmeters and more particularly to isolation amplifiers and ranging circuits especially suited for such flowmeters and similar applications.

Certain apparatus such as fluid flowmeters produce an analog output signal which must be processed or converted before it can be used externally of the apparatus. For example, in the case of a fluid flowmeter, the analog signal is indicative of flow rate. In a magnetic flowmeter a magnetic field across a flowtube generates a voltage in the fluid which is proportional to the flow rate. This voltage is sensed by a pair of electrodes in contact with the fluid and amplified by a signal processing system. More particularly, the analog output of the electrodes in these systems must be isolated by an isolation barrier from the external measuring equipment so as to maintain a true reading of flow rate.

In certain magnetic flowmeters, the analog signal output is converted to a digital signal, such as a train of pulses, the frequency of which is proportional to flow rate. Such a system is shown in U.S. Pat. No. 4,309,909 to Grebe, Jr. et al. entitled Crystal Stabilized Voltage to Frequency Converter with Digital Calibration for Flowmeters. Such systems work well for their intended purposes, but they could be improved. For example, such prior systems are believed to require high quality components to maintain the accuracy associated with such instrumentation. Such components may include crystal oscillators and counter/timers on both sides of the barrier.

In certain applications, the output of the flowmeter is supplied to external equipment which requires a certain range of signal from the flowmeter. Heretofore, the analog signal representative of flow rate could be scaled as follows. The analog signal would be converted by a voltage/frequency converter to produce a digital signal which was then scaled by a rate-multiplier circuit. The output of the rate multiplier was converted back to an analog signal using a frequency/voltage converter. Each conversion between analog signal and frequency has an error associated with it however. An alternative scheme would be to use a digital-to-analog converter (DAC) to scale the analog signal, but binary-coded-decimal (BCD) type DACs are not believed to be available at reasonable cost to more than three and one-half decimal places.

SUMMARY OF THE INVENTION

Among the various objects and features of the present invention may be noted the provision of an isolation amplifier which provides high accuracy with low cost.

Another object of the present invention may be noted the provision of such an isolation amplifier which is especially suited for use with a magnetic flowmeter.

Yet another object of the present invention is the provision of a method for providing isolation across a galvanic barrier of a magnetic flowmeter.

A fourth object of the present invention is the provision of an isolation amplifier especially suited for digital ranging of its analog output.

A fifth object of the present invention is the provision of a ranging circuit with improved accuracy and reduced errors.

Other objects and features will be in part apparent and in part pointed out hereinafter.

Briefly, an isolation amplifier of the present invention includes circuitry for converting an analog input signal to a duty cycle imposed upon a digital waveform, which circuitry includes a circuit for generating clock pulses for synchronizing the digital waveform. Transmitters are included for optically transmitting the digital waveform and information representative of the clock pulses across a barrier which would degrade the analog input signal. And receiver circuitry is provided for receiving the optically transmitted digital waveform and clock pulse information and recreating the digital waveform with imposed duty cycle therefrom.

A magnetic flowmeter of the present invention includes a body adapted to be connected in a flow system for flow of liquid therethrough, a coil for generating a magnetic field in the path of the fluid flowing through the body, a voltage source for applying a voltage waveform across the coil to generate the magnetic field, electrodes disposed transverse to the path of the fluid for detecting an induced voltage caused by the flow of the fluid through the magnetic field, and a flow sensor responsive to the electrodes for measuring the flow of the fluid. It also includes circuitry for converting an analog input signal from the electrodes to a duty cycle imposed upon a digital waveform, which circuitry includes a circuit for generating clock pulses for synchronizing the digital waveform. A transmitting circuit is provided for optically transmitting the digital waveform and information representative of the clock pulses across an isolation barrier which would otherwise degrade the analog input signal from the electrodes. A receiver circuit, disposed across the isolation barrier from the transmitting circuit, is provided for receiving the optically transmitted digital waveform and clock pulse information and recreating the digital waveform with imposed duty cycle therefrom.

Briefly, the method of the present invention includes the steps of converting an analog input signal to a duty cycle imposed upon a digital waveform, which step includes generating clock pulses for synchronizing the digital waveform, optically transmitting the digital waveform and information representative of the clock pulses across a barrier which would degrade the analog input signal, receiving the optically transmitted digital waveform and clock pulse information, and recreating the digital waveform with imposed duty cycle therefrom.

BRIEF DESCRIPTION OF THE DRAWINGS

Similar reference characters indicate similar parts throughout the several views of the drawings.

DESCRIPTION OF THE PREFERRED EMBODIMENT

Figure 1:
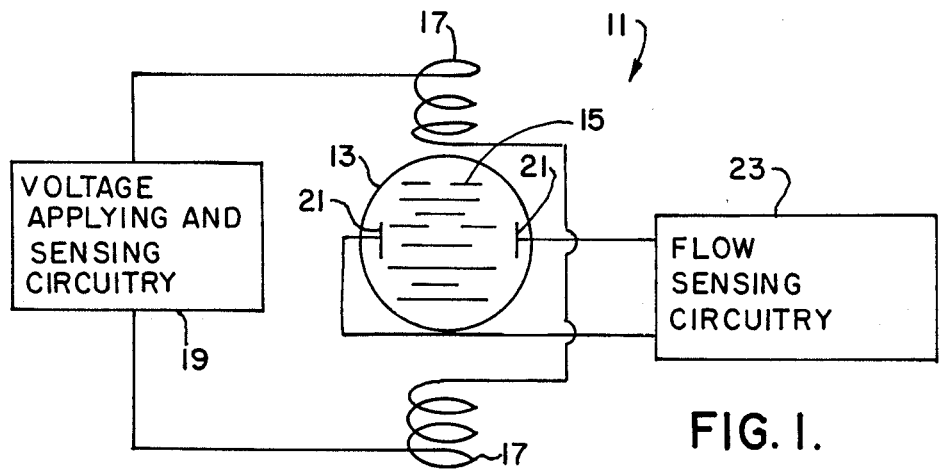
FIG. 1 is a schematic of a magnetic flowmeter of the present invention.

A magnetic flowmeter system 11 of the present invention (FIG. 1) includes a flowtube 13 adapted to be connected in a flow system for flow of liquid 15 therethrough. System 11 further includes electromagnetic coils 17 suitably disposed around tube 13 for generating a magnetic field in the path of the fluid flowing through the tube 13. Voltage applying and current sensing circuitry 19 is provided for applying a voltage waveform across coils 17 to generate the magnetic field. Oppositely disposed electrodes 21 disposed transverse to the path of fluid 15 through tube 13 detect an induced voltage caused by the flow of the fluid through the magnetic field. The magnitude of the induced voltage is generally proportional to the rate of flow of the fluid. Electrodes 21 are connected to flow sensing circuitry 23 for suitably isolating, amplifying and displaying or recording the induced voltage signal representative of the rate of flow of the fluid.

Figure 2:
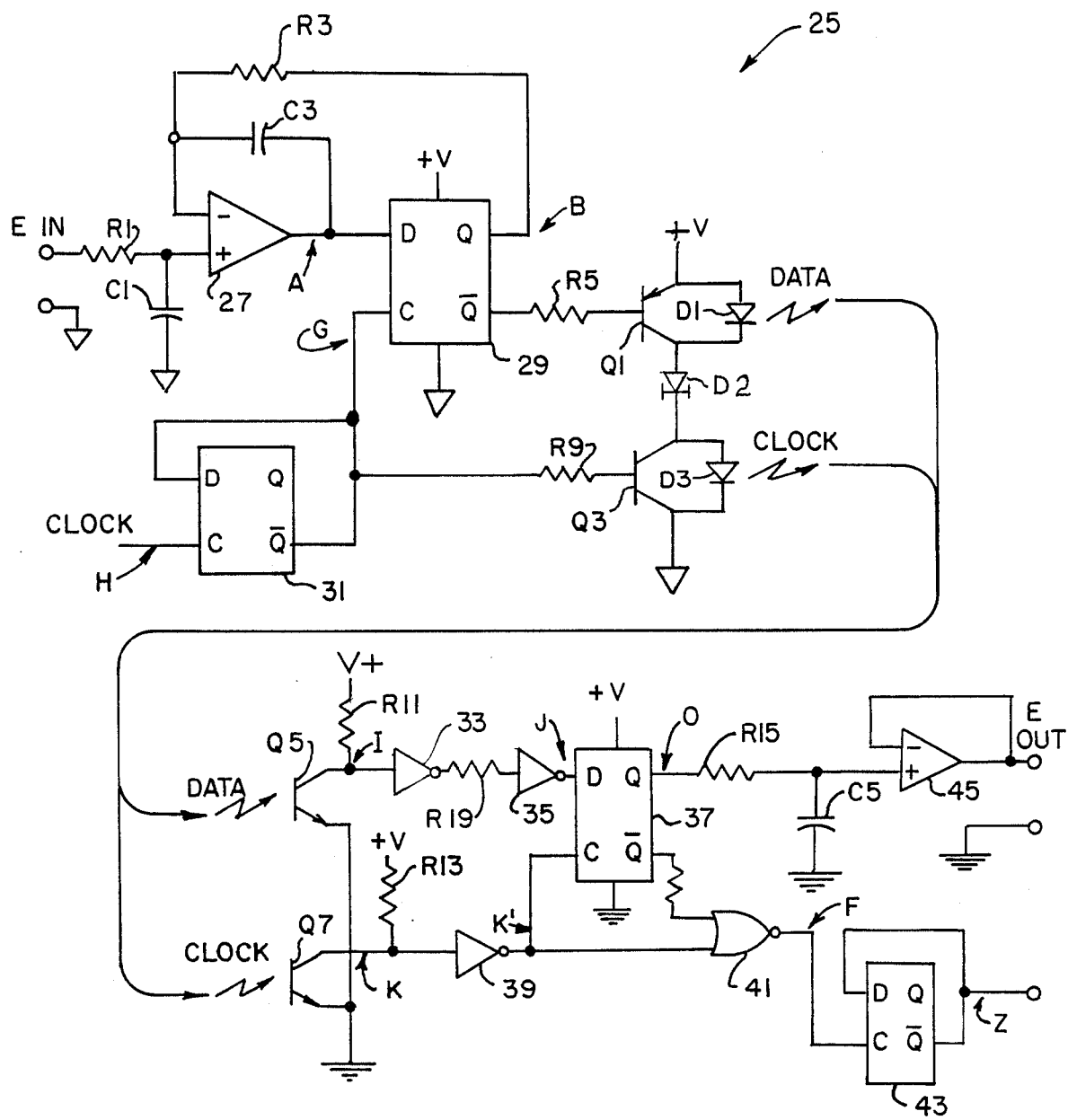
FIG. 2 is an electrical schematic of the isolation amplifier of the present invention.

The isolation feature of flow sensing circuitry 23 is accomplished by an isolation amplifier 25 (FIG. 2). The signal from electrodes 29, labeled "E IN" in FIG. 2 is supplied through a filter consisting of a resistor R1 and a capacitor C1 to the non-inverting input of an operational amplifier 27 configured as a integrator. More specifically, op-amp 27 includes a capacitor C3 connected between its output and its inverting input. The output of the op-amp 27, labeled A, is supplied to the D input of a D-type flip-flop 29. The Q output of flip-flop 27 is fed back through a resistor R3 to the inverting input of amplifier 27.

The clock input, labeled C, of flip-flop 29 is connected to the Q-bar output of a second flip-flop 31, whose clock input is supplied with suitable clock signals from a source not shown. The clock input to flip-flop 31 is labeled H on FIG. 2. The Q-bar output of flip-flop 31 is also supplied to the D input of the flip-flop so that flip-flop 31 functions to divide the input clock signal by two to produce a square wave. This square wave signal is labeled G on FIG. 2.

Figure 3:
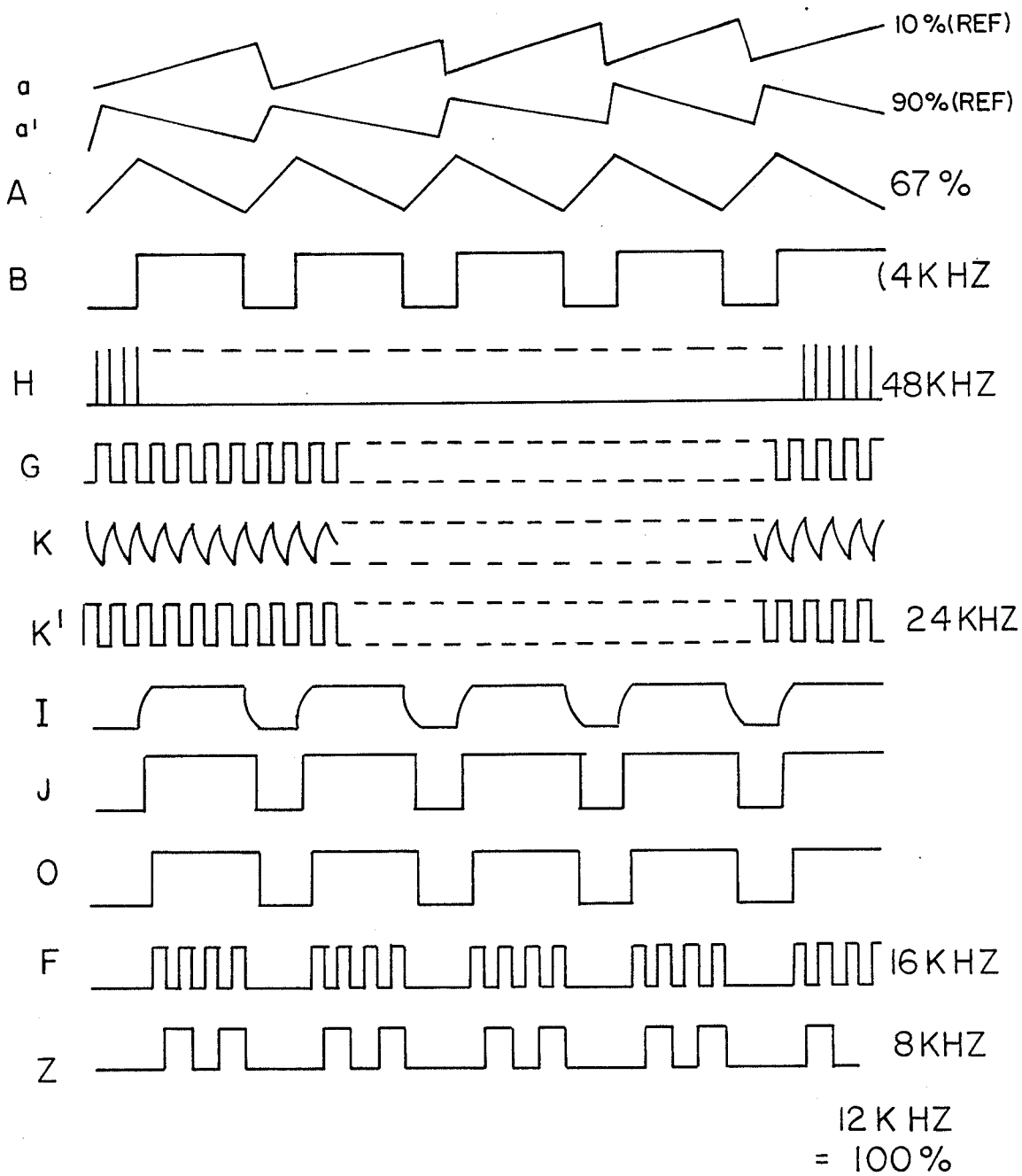
FIG. 3 is a graphical representation of the signals present at various locations in the amplifier of FIG. 2.

The Q output of flip-flop 29 is a duty-cycle signal labeled B (see FIG. 3) which rapidly swings between both rails of the input supply. This is used as feedback to the input integrator. More particularly, this signal from the Q output of flip-flop 29 is fed back to amplifier 27 through resistor R3. The voltage at the Q output is averaged over time and is equal to the input signal. The output of the integrator, labeled A in FIGS. 2 and 3, is a triangle wave which is used as the trigger voltage to the D input of flip-flop 29. If the ramping voltage has passed the trip level of the flip-flop, flip-flop 29 changes state at the next clock pulse indicated by line G in FIG. 3. When this occurs, the output of the integrator begins to ramp back and eventually passes the second threshold level and the flip-flop again changes state. This action holds the output of the integrator within the dynamic range producing the triangular wave A as shown in FIG. 3 as long as the analog input from the electrodes is within the proper voltage range for the particular components used.

The Q-bar output of flip-flop 29, which contains the electrode information in inverted digital form, is supplied through a resistor R5 to the base of a PNP transistor Q1. A light emitting diode (LED) D1 is connected across the emitter/collector circuit of transistor Q1 so that the signal from the Q-bar output of flip-flop 29 is optically transmitted by diode D1. To conserve power, the collector of transistor Q1 and the cathode of diode D1 are connected through a current regulator diode D2 to the collector of a second transistor Q3. The base of transistor Q3 is connected through a resistor R9 to the Q-bar output of flip-flop 31 so that the signal applied to the base of transistor Q3 is a clock signal. A second light emiting diode D3 is connected across the collector/emitter circuit of transistor Q3 and transmits the clock informaton optically across the isolation barrier.

The information transmitted by diode D1 is received by a phototransistor Q5 having its collector connected through a resistor R11 to a voltage source and its emitter connected to ground. Similarly, the clock information from diode D3 is received by a phototransistor Q7 connected to a voltage source through a resistor R13. Although diode D1 and transistor Q5 as well as diode D3 and transistor Q7 are described as separate components, it should be realized that these are actually contained in a pair of low-cost opto-couplers.

The voltage on the collector of phototransistor Q5 is a function of the digital data being transmitted from photodiode D1. This voltage, labeled I in FIG. 2, is buffered by a series connected pair of inverters 33 and 35, the latter of which is connected to the D input of a third flip-flop 37.

The voltage on the collector of phototransistor Q7 is labeled K and represents the clock information from diode D3. This clock information is buffered by an inverter 39 and is supplied as a voltage K' to the clock input of flip-flop 37. The inverted clock signal from inverter 39 is also supplied to one input of a NOR gate 41. The other input to NOR gate 41 is the Q-bar output of flip-flop 37. The output of NOR gate 41, labeled F, is supplied to a clock input of a fourth flip-flop 43. Flip-flop 43 functions as a divide by two flip-flop and its Q output, labeled Z, is the digital output of amplifier 25.

The Q output of flip-flop 37, on the other hand, is supplied through a resistor R15 and a capacitor C5 to a suitable buffer 45. The output "E OUT" of buffer 45 represents the analog output of amplifier 25 which, as will be seen, is a reconstruction of the input signal E IN from the electrodes 21. Resistor R15 and capacitor C5 act as an integrator to integrate the voltage signal labeled "0", which is the Q output of flip-flop 37. Resistor R15 may have a value of one mega-ohm and capacitor C5 may have a capacitance of two microfarads so that the integrator made up of these two components has a time constant of two seconds or thereabouts.

In general the operation of the circuit of FIG. 2 is as follows: The analog signal from electrodes 21 to be transmitted across the galvanic barrier is first converted to a duty-cycle which is snychronized by a clock. Both the clock and the duty-cycle information are transmitted across the barrier by low cost opto-couplers made up of LEDs D1 and D3 and phototransistors Q5 and Q7 and the duty-cycle is exactly reproduced on the output side and filtered and buffered to reproduce the true analog signal E OUT. In more detail, the analog signal E IN to be transmitted across the barrier is first converted to a duty-cycle by the integrator made up of amplifier 27, capacitor C5, and resistor R3 in combination with D-type flip-flop 29. The transitions between High and Low digital states are synchronized by the clock signal H and flip-flop 31. This duty-cycle can be as high as 100 percent or as low as zero percent. The conversion rate is not related to the output but rather is fixed by the values of resistor R3 and capacitor C3.

These values should be selected to produce a frequency of from 1 to 5 kHz at 50 percent input. This will produce a smooth analog output with a reasonable response time.

To synchronize the output E OUT of the isolation amplifier 25 with the input E IN requires clock signal H which can be generated by any semi-stable oscillator. If the digital output Z of the isolation amplifier is to be used, the clock should be crystal stablized. The frequency of the clock is not critical. It must be fast enough to produce a smooth output with good resolution, but slow enough to use low-cost opto-couplers. In the embodiment shown in FIG. 2, clock pulses H are from a 48 kHz precision source which is divided by flip-flop 31 to produce a 24 kHz squarewave G as shown in FIG. 3. Alternatively, a low cost RC timer could be used to generate the clock pulses G.

As described above, duty-cycle data is transmitted across the galvanic barrier by the opto-coupler consisting of LED D1 and phototransistor Q5, while the squarewave clock is transmitted across the barrier by the opto-coupler consisting of LED D3 and phototransistor Q7. For simplicity, each is transmitted using separate opto-couplers. It should also be realized that the clock signal can originate on either side of the galvanic barrier as desired. On the output side of the galvanic barrier, the signals from the opto-couplers, which include phototransisters Q5 and Q7, are amplified by buffers 33, 35, and 39 and are applied to flip-flop 37. Due to the rise and fall times of the opto-isolators, the duty-cycle signal from phototransistor Q5 is not true. This transmitted duty-cycle data is applied to the D input of flip-flop 37. However the change in output of flip-flip 37 does not take place until the next clock pulse which is received from phototransistor Q7. This resynchronization of the signal allows for much slower opto-couplers to be used without loss of valuable duty-cycle data. The clock is phased so that the duty-cycle reproduced on the output side of the barrier is one/half clock cycle behind the input duty-cycle to allow the opto-couplers to reach full amplitude.

The Q output of flip-flop 37, labeled 0 in FIGS. 2 and 3, is the reproduced duty-signal which swings rapidly between the supply rails. This signal is filtered by resistor R15 and capacitor C5. The values of resistance and capacitance of these components should be such as to limit the amplitude of the triangular wave which results from the RC filtering in view of desired response time to signal value changes. The averaged voltage is buffered by amplifier 45 and the output of amplifier 45 is the same as the input voltage supplied to the non-inverting input of amplifier 27 on the input side.

As an alternative to the circuits shown, the Q outputs of flip-flops 29 and 37 may be used to drive analog switches which are connected to precision voltage sources on both sides of the isolation barrier, which helps increase system accuracy.

Note that even though the actual cycle time for the circuit shown may be only four to six clock periods, and thus the resolution may appear to be no better than 33 percent, since the duty-cycle continually dithers by one clock period, the final output is averaged to produce a signal with a resolution of one part in 24,000 per second.

In addition to having the analog output described above, the digital data may also be extracted from the circuit as follows: The Q-bar output of flip-flop 37 is logically combined in NOR gate 41 with the clock signal from inverter 39 to gate the clock pulses out when the Q output is high. The digital output F of NOR gate 41 is not a true frequency but rather a 24 kHz pulse stream with missing pulses as shown in FIG. 3, which when totalized for one second resolves to a throughput accuracy of 0.005 per cent. This signal is fed through divide-by-two flip-flop 43 to produce the signal labeled Z in FIGS. 2 and 3. In actual practice, the digital pulse stream may be scaled by eight or more to give a resulting signal which is almost a true frequency with an approximately 50/50 duty-cycle at the same accuracy.

Figure 4:
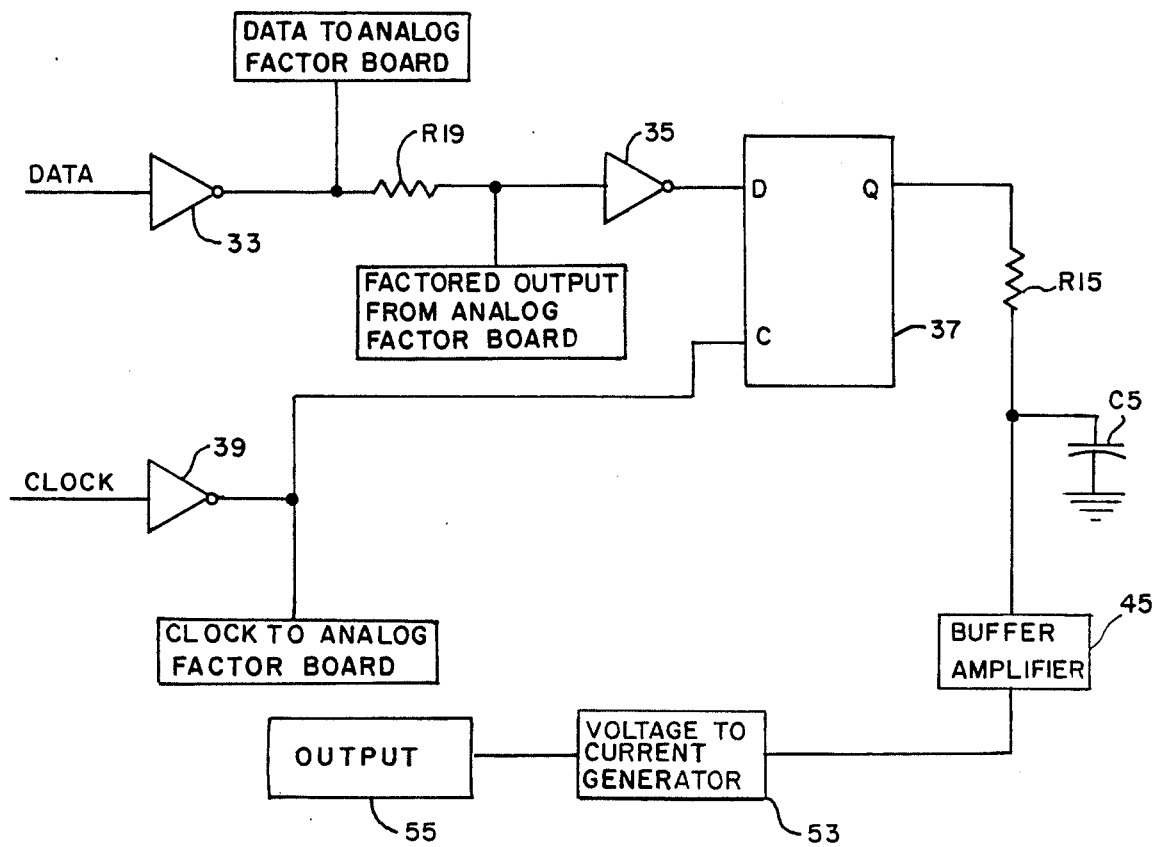
FIG. 4 is an electrical schematic/block diagram illustrating an alternative to a portion of the circuit of FIG. 2.

An alternative embodiment to a portion of the circuit shown in FIG. 2 is illustrated in FIG. 4. In this embodiment, data from inverter 33, which is in the form of a duty-cycle, is supplied through a 10K-ohm resistor R19 to inverter 35 and the flip-flop 37. This particular circuit includes junctions on either side of resistor R19 to allow the data from inverter 33 to be scaled or factored before being supplied to flip-flop 37. Scaling or ranging is desirable to allow the circuit to be used with specific external components, not shown, which require inputs of a certain range. When this function is used, the data from inverter 33 is sent to the circuit of FIG. 5 and the factored output of the circuit of FIG. 5 is sent back to the circuit of FIG. 4 as indicated by the legend "Factored Output from Analog Factor Board."

Figure 5:
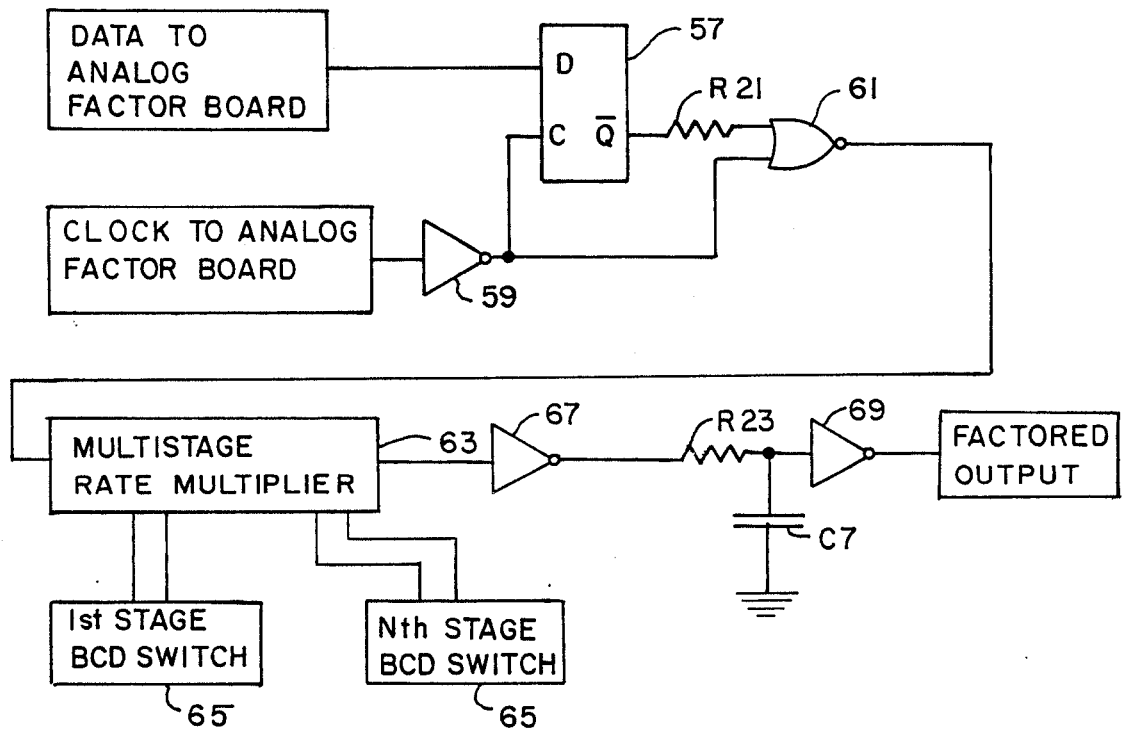
FIG. 5 is an electrical schematic/block diagram illustrating an analog factoring circuit of the present invention.

The circuit of FIG. 4 also includes a junction labeled "Clock to Analog Factor Board" to allow the clock signal from inverter 39 to be sent to the circuit of FIG. 5 as well. In addition, the circuit of FIG. 4 includes a conventional buffer amplifier which takes the signal from capacitor C5 and supplies it to a conventional voltage to current generator 53 to provide an output 55. Note that this output is a suitably ranged and spanned current suitable for use with external devices requiring such an input. Such an input might be, for example, four to twenty mAdc.

The analog ranging function is illustrated in FIG. 5. The data from inverter 33 of FIG. 4 is supplied to the D input of a flip-flop 57. The clock signal is supplied to the clock input of flip-flop 57 through an inverter 59. The Q-bar output of flip-flop 57 is supplied through a resistor R21 to a NOR gate 61 whose other input is the clock signal from inverter 59. The output of gate 61 is a stream of pulses, which is the same signal as would have appeared at "F" in FIG. 3 without factoring. This signal is supplied to a conventional multi-stage rate multiplier 63 which is controlled by a series of binary or binary coded decimal switches 65, one for each stage. Such multi-stage rate multipliers are known in the art. For example, a four-stage rate multiplier could include a type 4526 binary divide-by-N counter, a plurality of type 4527 decimal rate multiplier chips and suitable interface chips such as a type 4008 adder. Of course, other classic rate-multiplier circuits could be used as well.

The multi-stage rate multiplier 63 takes the stream of pulses from gate 61 and scales or factors it in accordance with the settings on the switches 65 to provide a scaled or factored output to an inverter 67. Inverter 67 provides a slight delay to ensure that the signal is stable before the clock rises on the circuit of FIG. 4. The output of inverter 67 is supplied through a 47.5K-ohm resistor R23 and a capacitor C7 to an inverter 69 whose output is the factored output of the circuitry of FIG. 5. This factored output is supplied back to the circuitry of FIG. 4 as shown to provide an input to inverter 35. When the circuitry of FIG. 5 is used, the resistor R19 is effectively shunted out by the circuit. The final output of the circuitry of FIG. 5 is a stream of pulses which is proportional to the input pulse rate divided by the rate-multiplier value. The duty-cylce information is restored by flip-flop 37 in FIG. 4. For example, a factor of 1.001 passes 99.9% of original signal.

In view of the above it will be seen that the various objects and features of the present invention are achieved and other advantageous results obtained. As various changes could be made in the above constructions and methods without departing from the scope of the invention, it is intended that all matter contained in the above description and shown in the accompanying drawings shall be interpreted as illustrative and not in a limiting sense.

What is claimed is:

1. An isolation amplifier for analog input signals comprising:
   means for converting an analog input signal to a duty cycle imposed upon a digital waveform, said means including means for generating clock pulses for synchronizing the digital waveform;
   means for optically transmitting the digital waveform and information representative of the clock pulses across a barrier which would degrade the analog input signal; and
   means for receiving the optically transmitted digital waveform and clock pulse information and recreating the digital waveform with imposed duty cycle therefrom.

2. The isolation amplifier as set forth in claim 1 further including means for converting the recreated digital waveform with imposed duty cycle to a digital pulse stream whose number of pulses in a predetermined length of time represents the value of the original analog input signal.

3. The isolation amplifier as set forth in claim 1 further including means for converting the recreated digital waveform with imposed duty cycle to an analog output signal.

4. The isolation amplifier as set forth in claim 1 wherein the means for converting the analog input signal includes an integrator for integrating the analog input signal, and a logic element such as a flip-flop having a voltage sensitive control terminal connected to the output of the integrator.

5. The isolation amplifier as set forth in claim 4 wherein the logic element includes a clock input terminal connected to the clock pulse generating means.

6. The isolation amplifier as set forth in claim 4 wherein one output of the logic element is fed back to an input of the integrator so that the output of the integrator is a function of the analog signal and the digital waveform.

7. The isolation amplifier as set forth in claim 4 wherein the value of the analog input signal is related to the duty cycle of the digital waveform by a conversion factor, said conversion factor being determined by the integrator.

8. The isolation amplifier as set forth in claim 7 wherein the clock pulse means has a clock rate greater than 20 KHz and the integration time of the integrator is selected to provide a digital output waveform having a frequency of at least approximately 1 kHz at 50% input.

9. The isolation amplifier as set forth in claim 4 wherein the output of the integrator is a triangle waveform.

10. The isolation amplifier as set forth in claim 1 wherein the optical transmitting means includes an opto-coupler for the digital waveform and an opto-coupler for the clock pulse information.

11. The isolation amplifier as set forth in claim 1 wherein the means for recreating the digital waveform includes a logic element such as a flip-flop having a control terminal and a clock input terminal, the transmitted digital waveform with imposed duty cycle being suplied to the control terminal of the logic element and the transmitted clock pulse information being supplied to the clock input terminal of the logic element.

12. The isolation amplifier as set forth in claim 11 wherein an output of the logic element is the recreated digital waveform with imposed duty cycle.

13. The isolation amplifier as set forth in claim 12 further including means for filtering the recreated digital waveform to generate an analog output signal isolated from the analog input signal.

14. The isolation amplifier as set forth in claim 12 further including means responsive to the recreated digital waveform and to the clock pulse information for generating a pulse stream whose number of pulses per predetermined time interval represents the value of the analog input signal.

15. The isolation amplifier as set forth in claim 1 further including means for ranging the recreated digital waveform.

16. The isolation amplifier as set forth in claim 15 wherein the ranging means includes means responsive to the recreated duty-cycle signal and to a clock signal for generating a frequency signal proportional to the duty-cycle signal.

17. The isolation amplifier as set forth in claim 16 wherein the ranging means further includes a multistage digital rate multiplier connected to the frequency generating means.

18. The isolation amplifier as set forth in claim 17 wherein the ranging means further includes timing means for phasing the output of the multistage digital rate multiplier.

19. A method of providing isolation for analog input signals comprising the steps of:
   converting an analog input signal to a duty cycle imposed upon a digital waveform, said converting step including generating clock pulses for synchronizing the digital waveform;
   optically transmitting the digital waveform and information representative of the clock pulses across a barrier which would degrade the analog input signal; and
   receiving the optically transmitted digital waveform and clock pulse information and recreating the digital waveform with imposed duty cycle therefrom.

20. The method as set forth in claim 19 further including the step of converting the recreated digital waveform with imposed duty cycle to a digital pulse stream whose number of pulses in a predetermined length of time represents the value of the original analog input signal.

21. The method as set forth in claim 19 further including the step of converting the recreated digital waveform with imposed duty cycle to an analog output signal.

22. The method as set forth in claim 19 wherein the converting of the analog input signal step includes integrating the analog input signal.

23. The method as set forth in claim 22 wherein the integration is a function of the analog signal and the digital waveform.

24. The method as set forth in claim 22 wherein the value of the analog input signal is related to the duty cycle of the digital waveform by a conversion factor.

25. The method as set forth in claim 24 wherein the digital output waveform has a frequency of at least approximately 1 kHz at mid-scale input.

26. The method as set forth in claim 22 wherein the integration results in a triangle waveform.

27. The method as set forth in claim 19 further including filtering the recreated digital waveform to generate an analog output signal isolated from the analog input signal.

28. The method as set forth in claim 19 further including generating a pulse stream whose number of pulses per predetermined time interval represents the value of the analog input signal.

29. The method as set forth in claim 19 further including the step of ranging the recreated digital duty-cycle waveform.

30. The method as set forth in claim 29 wherein the ranging step includes generating a frequency signal proportional to the duty-cycle signal.

31. The method as set forth in claim 30 wherein the ranging step further includes converting the frequency signal in a multistage digital rate multiplier.

32. In a magnetic flowmeter comprising a body adapted to be connected in a flow system for flow of liquid therethrough, coil means for generating a magnetic field in the path of the fluid flowing through the body, voltage means for applying a voltage waveform across the coil means to generate the magnetic field, electrode means disposed transverse to the path of the fluid for detecting an induced voltage caused by the flow of the fluid through the magnetic field, and flow sensing means responsive to the electrodes for measuring the flow of the fluid, the improvement comprising:
   means for converting an analog input signal from the electrodes to a duty cycle imposed upon a digital waveform, said means including means for generating clock pulses for synchronizing the digital waveform;
   means for optically transmitting the digital waveform and information representative of the clock pulses across an isolation barrier which would otherwise degrade the analog input signal from the electrodes; and
   means disposed across the isolation barrier from the transmitting means for receiving the optically transmitted digital waveform and clock pulse information and recreating the digital waveform with imposed duty cycle therefrom.

33. The magnetic flowmeter as set forth in claim 32 further including means for converting the recreated digital waveform with imposed duty cycle to a digital pulse stream whose number of pulses in a predetermined length of time represents the value of the original analog input signal from the electrodes.

34. The magnetic flowmeter as set forth in claim 32 further including means for converting the recreated digital waveform with imposed duty cycle to an analog output signal.

35. The magnetic flowmeter as set forth in claim 32 wherein the means for converting the analog input signal includes an integrator for integrating the analog input signal, and a logic element such as a flip-flop having a control terminal connected to the output of the integrator.

36. The magnetic flowmeter as set forth in claim 35 wherein the logic element includes a clock input terminal connected to the clock pulse generating means.

37. The magnetic flowmeter as set forth in claim 35 wherein one output of the logic element is fed back to an input of the integrator so that the output of the integrator is a function of the analog signal and the digital waveform.

38. The magnetic flowmeter as set forth in claim 35 wherein the value of the analog input signal is related to the duty cycle of the digital waveform by a conversion factor, said conversion factor being determined by the integrator.

39. The magnetic flowmeter as set forth in claim 38 wherein the clock pulse means has a clock rate greater than 20 KHz and the integration time of the integrator is selected to provide a digital output waveform having a frequency of at least approximately 1 kHz at mid-scale input.

40. The magnetic flowmeter as set forth in claim 35 wherein the output of the integrator is a triangle waveform.

41. The magnetic flowmeter as set forth in claim 32 wherein the optical transmitting means includes an opto-coupler for the digital waveform and an opto-coupler for the clock pulse information.

42. The magnetic flowmeter as set forth in claim 32 wherein the means for recreating the digital waveform includes a logic element such as a flip-flop having a control terminal and a clock input terminal, the transmitted digital waveform with imposed duty cycle being supplied to the control terminal of the logic element and the transmitted clock pulse information being supplied to the clock input terminal of the logic element.

43. The magnetic flowmeter as set forth in claim 42 wherein an output of the logic element is the recreated digital waveform with imposed duty cycle.

44. The magnetic flowmeter as set forth in claim 43 further including means for filtering the recreated digital waveform to generate an analog output signal isolated from the analog input signal.

45. The magnetic flowmeter as set forth in claim 43 further including means responsive to the recreated digital waveform and to the clock pulse information for generating a pulse stream whose number of pulses per predetermined time interval represents the value of the analog input signal.

46. The magnetic flowmeter as set forth in claim 32 further including means for ranging the recreated digital waveform.

47. The magnetic flowmeter as set forth in claim 46 wherein the ranging means includes means responsive to the recreated duty-cycle signal and to a clock signal for generating a frequency signal proportional to the duty-cycle signal.

48. The magnetic flowmeter as set forth in claim 47 wherein the ranging means further includes a multistage digital rate multiplier connected to the frequency generating means.

49. The magnetic flowmeter as set forth in claim 48 wherein the ranging means further includes timing means for phasing the output of the multistage digital rate multiplier.

* * * * *